(12) United States Patent
Kondo

(10) Patent No.: US 12,295,104 B2
(45) Date of Patent: May 6, 2025

(54) COMPONENT MOUNTING DEVICE AND CORRECTION VALUE MANAGING METHOD

(71) Applicant: FUJI CORPORATION, Chiryu (JP)

(72) Inventor: Daigo Kondo, Toyota (JP)

(73) Assignee: FUJI CORPORATION, Chiryu (JP)

( * ) Notice: Subject to any disclaimer, the term of this patent is extended or adjusted under 35 U.S.C. 154(b) by 404 days.

(21) Appl. No.: 17/774,449

(22) PCT Filed: Nov. 6, 2019

(86) PCT No.: PCT/JP2019/043547
§ 371 (c)(1),
(2) Date: May 4, 2022

(87) PCT Pub. No.: WO2021/090415
PCT Pub. Date: May 14, 2021

(65) Prior Publication Data
US 2022/0394894 A1 Dec. 8, 2022

(51) Int. Cl.
*H05K 13/08* (2006.01)
*G05B 19/418* (2006.01)
*H05K 13/04* (2006.01)

(52) U.S. Cl.
CPC ..... *H05K 13/083* (2018.08); *G05B 19/41805* (2013.01); *H05K 13/04* (2013.01); *G05B 2219/36195* (2013.01)

(58) Field of Classification Search
CPC .... H05K 13/083; H05K 13/04; H05K 13/089; H05K 13/0815; G05B 19/41805; G05B 2219/36195
See application file for complete search history.

(56) References Cited

U.S. PATENT DOCUMENTS

2011/0235129 A1* 9/2011 Ohkawa ............. H04N 1/00063
358/406
2016/0227684 A1* 8/2016 Kamio ............... H05K 13/0404
(Continued)

FOREIGN PATENT DOCUMENTS

EP 1 098 167 A2 5/2001
EP 3 119 176 A1 1/2017
(Continued)

OTHER PUBLICATIONS

International Search Report mailed on Jan. 28, 2020, in PCT/JP2019/043547 filed on Nov. 6, 2019 (2 pages).

*Primary Examiner* — Charles Cai
(74) *Attorney, Agent, or Firm* — Oblon, McClelland, Maier & Neustadt, L.L.P.

(57) ABSTRACT

A component mounting device that performs mounting processing for mounting a component on a board based on a production program, includes: a storage section configured to store information; a setting section configured to set a correction value related to a mounting position of the component included in the production program; a storage control section configured to make the storage section store date and time information on which calibration related to the mounting processing is executed when the calibration is executed, and to make the storage section store the correction value in association with latest date and time information of the calibration when the correction value is set; and a correction section configured to perform a correction related to the mounting position using the correction value corresponding to the latest date and time information of the calibration without using the correction value not corresponding to the latest date and time information.

5 Claims, 7 Drawing Sheets

(56) References Cited

U.S. PATENT DOCUMENTS

2018/0199480 A1* 7/2018 Taniguchi .......... H05K 13/0815
2018/0284730 A1   10/2018 Minoru

FOREIGN PATENT DOCUMENTS

| JP | 2015-2230 A | 1/2015 |
| JP | 2015-153914 A | 8/2015 |
| JP | 2017-194921 A | 10/2017 |
| JP | 2018-113337 A | 7/2018 |
| WO | WO 2017/072887 A1 | 5/2017 |

* cited by examiner

COMPONENT MOUNTING DEVICE AND CORRECTION VALUE MANAGING METHOD

TECHNICAL FIELD

The present specification discloses a component mounting device and a correction value managing method.

BACKGROUND ART

Conventionally, there has been proposed a component mounting device that corrects various setting parameters such as a mounting position included in a production program when mounting a component, based on the inspection result of the mounting state of the component on a board or the like, as a component mounting device of this type (for example, see patent Literature 1). In this device, a scene is defined for each predetermined time after production is paused and restarted, the same setting parameters are used assuming that the same scene has the same tendency of quality variation, and the setting parameters are changed when the scene is changed, thereby stabilizing the quality.

Patent Literature

Patent Literature 1: JP-A-2015-153914

BRIEF SUMMARY

Technical Problem

In the above-mentioned component mounting device, since correction values such as the setting parameters are changed depending on the scene for each predetermined time, the setting of the correction value may be complicated. In addition, it is also considered that in a case where the quality is stable at a certain correction value, it is preferable to continuously use the correction value rather than to change the correction value for each scene. However, it is necessary not to continuously use the same correction value before and after changes that affect the mounting state of the component, such as the execution of device calibration and the update of production programs.

A main object of the present disclosure is to appropriately use a correction value when mounting a component without complicated processing.

Solution to Problem

The present disclosure employs the following means in order to achieve the above-mentioned main object.

A gist of a first component mounting device of the present disclosure that performs mounting processing for mounting a component on a board based on a production program is a component mounting device including: a storage section configured to store information; a setting section configured to set a correction value related to a mounting position of the component included in the production program; a storage control section configured to make the storage section store date and time information on which calibration related to the mounting processing is executed when the calibration is executed, and to make the storage section store the correction value in association with latest date and time information of the calibration when the correction value is set; and a correction section configured to perform a correction related to the mounting position using the correction value corresponding to the latest date and time information of the calibration without using the correction value not corresponding to the latest date and time information.

The first component mounting device of the present disclosure makes the storage section store the date and time information on which the calibration related to the mounting processing is executed, and makes the storage section store the correction value in association with the latest date and time information of the calibration when the correction value is set. Then, the first component mounting device of the present disclosure performs the correction related to the mounting position using the correction value corresponding to the latest date and time information of the calibration without using the correction value not corresponding to the latest date and time information. With this, the correction value set before the execution of the calibration is continuously used even after the execution of the calibration, so that it is possible to restrain the occurrence of a defect related to the mounting position on the contrary. Further, for that purpose, simple processing of storing the correction value in association with the latest date and time information of the calibration need only be performed, and there is no need to perform complicated processing. Accordingly, the correction value when the component is mounted can be appropriately used without complicated processing.

A gist of a second component mounting device of the present disclosure that performs mounting processing for mounting a component on a board based on a production program is a component mounting device including: a storage section configured to store information; a setting section configured to set a correction value related to a mounting position of the component included in the production program; a storage control section configured to make the storage section store date and time information on which the production program is created or updated for each production program, and to make the storage section store the correction value in association with latest date and time information of the production program when the correction value is set; and a correction section configured to perform a correction related to the mounting position using the correction value corresponding to the latest date and time information of the production program without using the correction value not corresponding to the latest date and time information.

The second component mounting device of the present disclosure makes the storage section store the date and time information on which the production program is created or updated, and makes the storage section store the correction value in association with the latest date and time information of the production program when the correction value is set. Then, the second component mounting device of the present disclosure performs the correction related to the mounting position using the correction value corresponding to the latest date and time information of the production program without using the correction value not corresponding to the latest date and time information. With this, the correction value set before the update of the production program is continuously used even after the update of the production program, so that it is possible to restrain the occurrence of a defect related to the mounting position on the contrary. Further, for that purpose, simple processing of storing the correction value in association with the latest date and time information of the production program need only be performed, and there is no need to perform complicated processing. Accordingly, the correction value when the component is mounted can be appropriately used without complicated processing.

DESCRIPTION OF EMBODIMENTS

Figure 1:
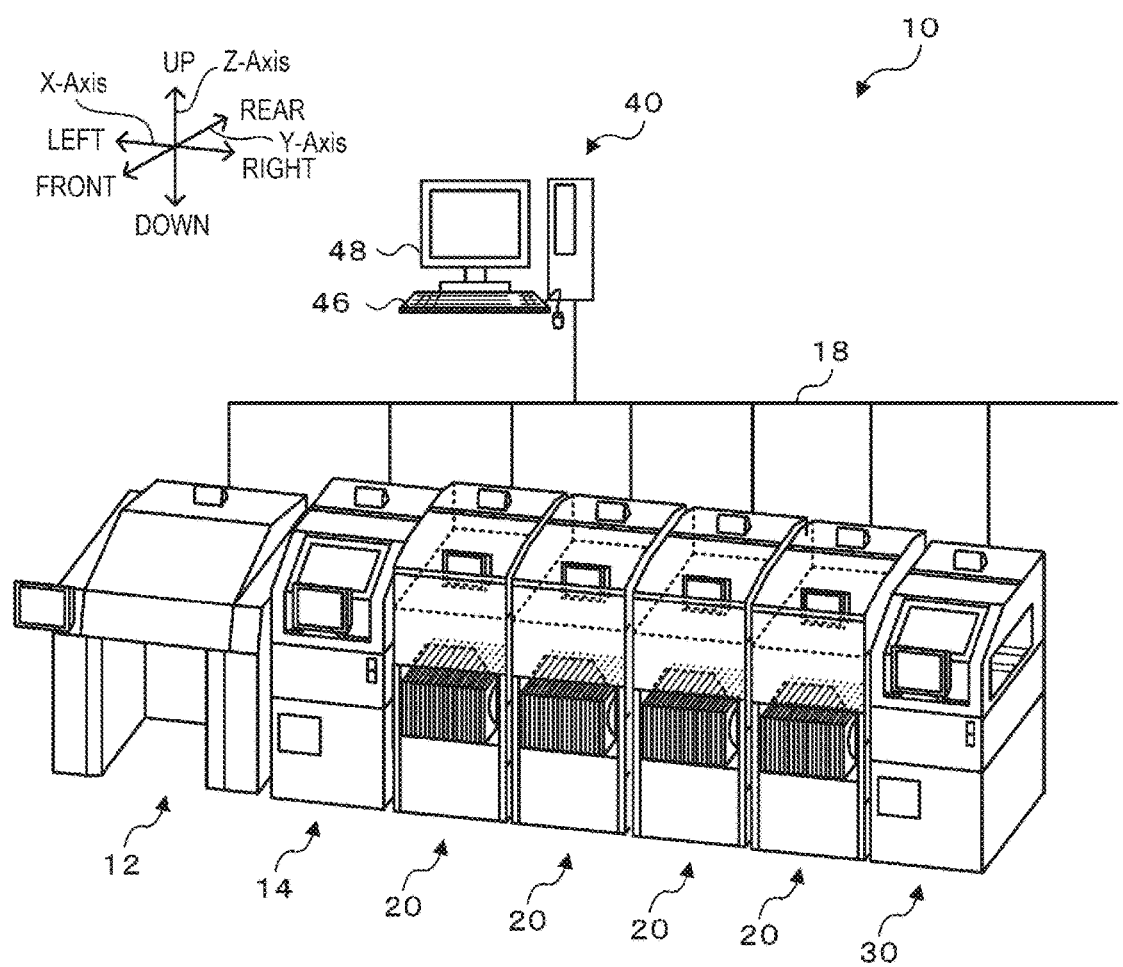
FIG. 1 is a configuration view showing an outline of a configuration of board work system 10.
Figure 2:
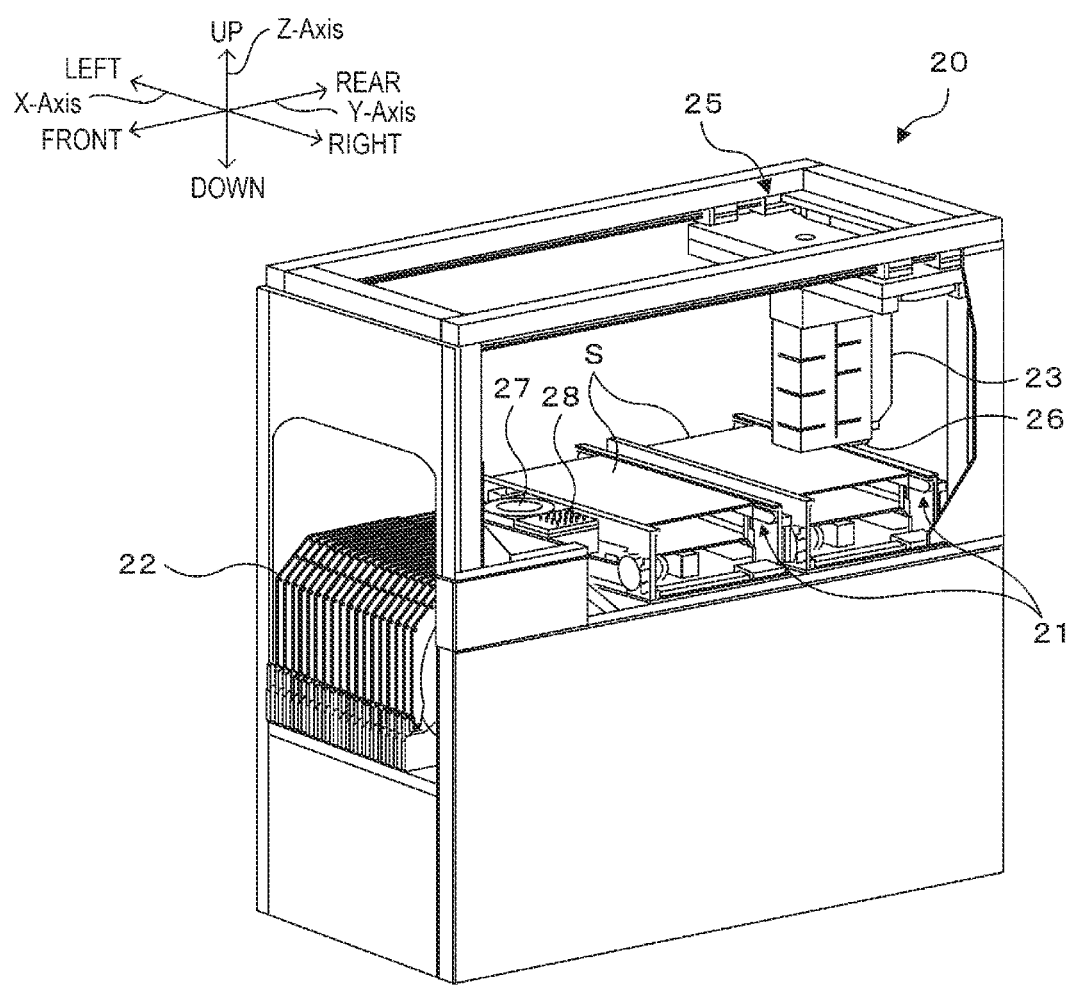
FIG. 2 is a configuration view showing an outline of a configuration of mounting device 20.
Figure 3:
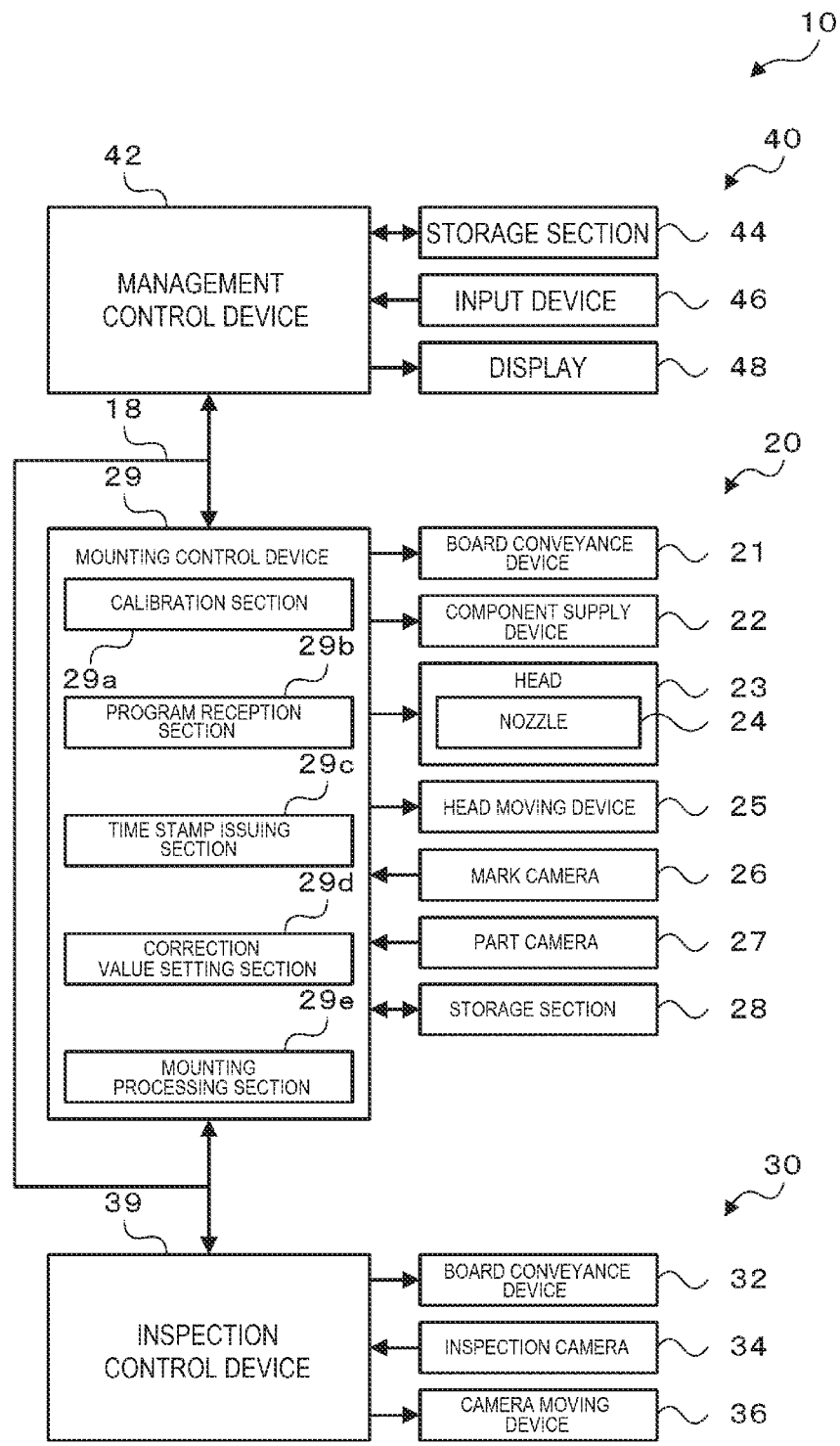
FIG. 3 is a diagram illustrating an electrical connection relationship between mounting device 20, management device 40, and mounting inspection device 30.

Next, embodiments of the present disclosure will be described with reference to the drawings. FIG. 1 is a configuration view showing an outline of a configuration of board work system 10, FIG. 2 is a configuration view showing an outline of a configuration of mounting device 20, and FIG. 3 is a diagram illustrating an electrical connection relationship between mounting device 20, management device 40, and mounting inspection device 30. In FIGS. 1 and 2, the right-left direction is an X-direction, the front-rear direction is a Y-direction, and the up-down direction is a Z-direction.

As shown in FIG. 1, board work system 10 includes printing device 12, print inspection device 14, multiple mounting devices 20, mounting inspection device 30, and management device 40, and these devices are connected to LAN 18 as a network. Printing device 12 prints on board S (see FIG. 2) by pushing solder into pattern holes formed in the screen mask. Print inspection device 14 inspects the state of the solder printed by printing device 12. Mounting devices 20 are disposed along the conveyance direction (X-direction) of board S, and mount components on board S. Mounting inspection device 30 inspects the mounting state of the component that is mounted on board S by mounting device 20. Management device 40 manages entire board work system 10. Printing device 12, print inspection device 14, multiple mounting devices 20, and mounting inspection device 30 are installed side by side in this order in the conveyance direction of board S to form a production line. In addition to these devices, the production line may be provided with a reflow device that performs a reflow process of board S on which the component is mounted or the like, and mounting inspection device 30 may be disposed on the downstream side of the reflow device.

As shown in FIGS. 2 and 3, mounting device 20 includes board conveyance device 21 that conveys board S, component supply device 22 that supplies the component, and head 23 in which nozzle 24 that picks up the component is disposed so as to be moved up and down, and head moving device 25 that moves head 23 in the XY-directions. Board conveyance device 21 has two pairs of conveyor belts provided with a gap therebetween in the front and rear of FIG. 2 and spanned in the right-left direction, and conveys board S from left to right in FIG. 2 using each conveyor belt. Component supply device 22 is, for example, a tape feeder that supplies components by sending out a tape in which the components are accommodated at a predetermined pitch, and multiple component supply devices 22 are set in mounting device 20 such that multiple types of components can be supplied. In addition to these, mounting device 20 includes mark camera 26, part camera 27, storage section 28, and mounting control device 29 that controls entire mounting device 20. Mark camera 26 is attached to head 23 and images a reference mark, a board ID, and the like affixed to board S, from above. Part camera 27 is installed between component supply device 22 and board conveyance device 21, and images the component picked up by nozzle 24, from below. Storage section 28 is a device such as an HDD that stores information such as a processing program, a correction value related to a mounting position of a component, and various histories.

Mounting control device 29 is constituted of a well-known CPU, ROM, RAM, and the like. Mounting control device 29 outputs drive signals to board conveyance device 21, head 23, head moving device 25, and the like. Images from mark camera 26 and part camera 27 are input to mounting control device 29. For example, mounting control device 29 processes the image of board S captured by mark camera 26 to acquire the board ID, or to identify the position of the board mark affixed to board S to recognize the position of board S. Further, mounting control device 29 determines whether the component is picked up by nozzle 24 or determines the pickup orientation of the component, based on the image captured by part camera 27.

Further, mounting control device 29 includes calibration section 29a, program reception section 29b, time stamp issuing section 29c, correction value setting section 29d, and mounting processing section 29e as functional blocks. Calibration section 29a performs calibration related to mounting processing. For example, calibration section 29a performs calibration related to the movement position of head 23, calibration related to the up-down position of nozzle 24, calibration related to parameters such as the focal length and the imaging center position of mark camera 26 or part camera 27, or the like. Program reception section 29b receives a production program (production job) output by management device 40, and transmits the received production program to mounting processing section 29e to make mounting processing section 29e execute mounting processing. Time stamp issuing section 29c issues a time stamp according to the time measured by the internal clock of mounting control device 29. For example, time stamp issuing section 29c issues the time stamp indicating the date and time when the execution of the calibration by calibration section 29a is completed and when the production program is received by program reception section 29b.

Figure 4A:
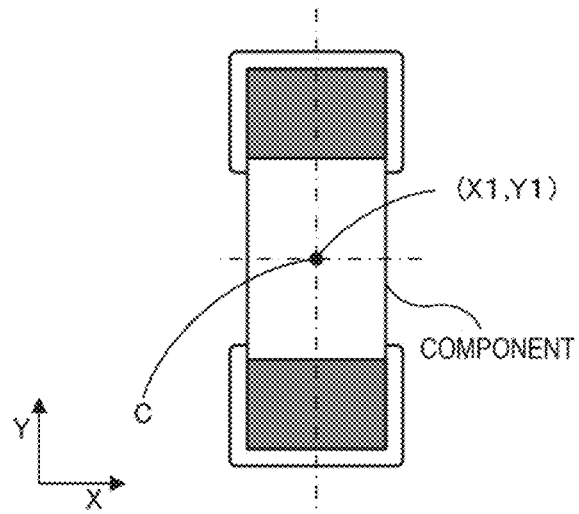
FIG. 4 is a view illustrating an example of a correction value set based on an inspection result.
Figure 4B:
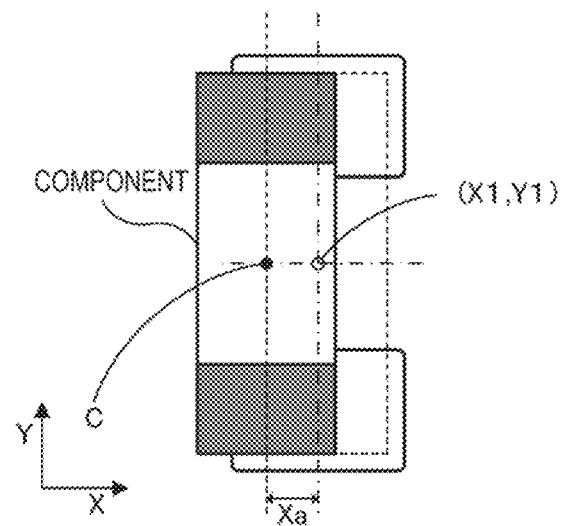
Figure 4C:
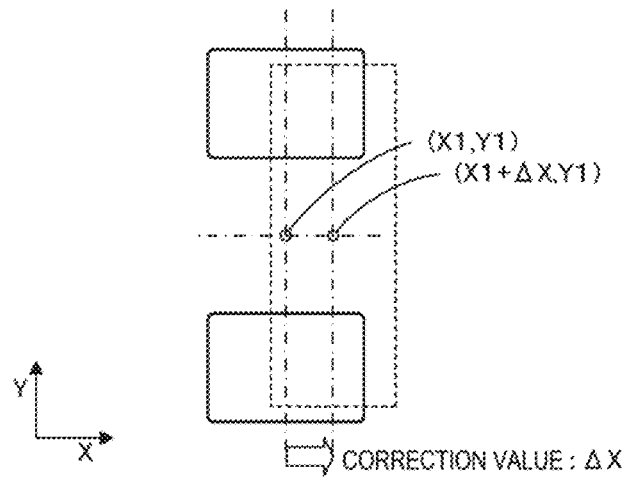

Correction value setting section 29d sets the correction value related to the mounting position of the component so as to cancel deviation, based on the tendency of the positional deviation or rotational deviation of the component in the inspection result of mounting inspection device 30. Correction value setting section 29d sets a correction value $\Delta X$ in the X-direction or a correction value $\Delta Y$ in the Y-direction on a side opposite to the positional deviation, in a case where there is a certain tendency in the deviation amount in the X-direction or the deviation amount in the Y-direction with respect to the mounting position of the component. Further, correction value setting section 29d sets an angle correction value $\Delta\theta$ on a side opposite to the rotational deviation in a case where there is a certain tendency in the rotational deviation amount (angle) with respect to the mounting position of the component. FIG. 4 is a view illustrating an example of a correction value set based on the inspection result. FIG. 4 shows a state (FIG. 4B) in which a component deviates and is mounted with a deviation amount Xa to the left side in the X-direction, from the normal mounting position at which the component does not deviate (FIG. 4A). Further, in the inspection results of multiple boards S, it is assumed that the components at the same mounting position have the tendency of the same positional deviation and that it is desired to take action against the positional deviation at hand rather than to investigate the cause of the positional deviation. In that case, correction value setting section 29d sets a correction value ΔX for changing the mounting position by the deviation amount Xa to the right side in FIG. 4 in association with the mounting position and the component type, and takes action against the positional deviation at hand (FIG. 4C), in order to cancel the positional deviation. When the mounting position (X1, Y1) is corrected based on this correction value ΔX, the mounting position (X1, Y1) is corrected to a mounting position (X1+ΔX, Y1), and it is possible to restrain the positional deviation of the deviation amount Xa for the time being. However, when the cause of the deviation is eliminated, deviation of ΔX (deviation amount Xa) to the right side in the X-direction occurs. Correction value setting section 29d may set the correction value received from the operator or management device 40. Mounting processing section 29e acquires information on the component type, information on the mounting order of each component, information on the mounting position or mounting angle of each component, or the like from the production program transmitted from program reception section 29b, and executes processing for mounting the component on board S. In a case where there is a correction value set by correction value setting section 29d, the component is mounted on board S after the correction value is reflected to the mounting position or the mounting angle.

As shown in FIG. 3, mounting inspection device 30 includes board conveyance device 32 that conveys board S on which a component is mounted, inspection camera 34 that captures an inspection image for inspecting the mounting state of the component, camera moving device 36 that moves inspection camera 34 in the XY-directions, and inspection control device 39 that controls entire mounting inspection device 30. Board conveyance device 32 and camera moving device 36 have the same configurations as board conveyance device 21 and head moving device 25 of mounting device 20, respectively.

Inspection control device 39 is constituted of a well-known CPU, ROM, RAM, and the like. Inspection control device 39 outputs drive signals to board conveyance device 32 and camera moving device 36 and imaging signals to inspection camera 34. Further, images from inspection camera 34 are input to inspection control device 39, and inspection control device 39 processes the image to inspect the positional deviation of the mounting position of the component, the rotational deviation of the mounting angle, the lacking component, the missing component, and the like. Inspection control device 39 detects the deviation amount in the X-direction and the deviation amount in the Y-direction and detects the rotational deviation amount (angle) with respect to the reference direction, in association with the mounting position of the component, as the positional deviation and the rotational deviation of the component. Further, inspection control device 39 is communicably connected to mounting control device 29 and management control device 42 of management device 40 via LAN 18, and transmits information regarding the inspection result and the like.

As shown in FIG. 3, management device 40 includes management control device 42, storage section 44, input device 46, and display 48. Management control device 42 is constituted of a well-known CPU, ROM, RAM, and the like. Storage section 44 is a device such as an HDD that stores various kinds of information such as a processing program. Input device 46 includes a keyboard, a mouse, and the like for the operator to input various commands. Display 48 is a liquid crystal display device that displays various kinds of information. Further, the production program is stored in storage section 44. In the production program, for each mounting device 20, information on the component type that is mounted on board S, information on the mounting order of each component, information on the mounting position and the mounting angle of each component, information on the shape of each component, information on component supply device 22 that supplies each component, information on head 23 used for mounting the component, information on nozzle 24 that picks up the component, information on the number of boards S that are produced, and the like are defined. Management control device 42 is communicably connected to mounting control device 29 via LAN 18, and receives information regarding the mounting status from mounting control device 29 or transmits the production program to mounting control device 29. Further, management control device 42 is communicably connected to inspection control device 39 via LAN 18, and receives information regarding the inspection status or the inspection result from inspection control device 39, or transmits information on board S of an inspection target to inspection control device 39. In addition to these, management control device 42 is communicably connected to each control device (not shown) of printing device 12 and print inspection device 14 via LAN 18, and receives information regarding the work status from each device or transmits a work instruction.

Hereinafter, an operation of mounting device 20 of the present embodiment configured as described heretofore will be described. In the component mounting processing in mounting device 20, mounting control device 29 first controls head moving device 25 to move head 23 above the component supply position of component supply device 22 and lowers nozzle 24 to make nozzle 24 pick up the component supplied to the component supply position. Next, mounting control device 29 controls head moving device 25 to move head 23 above part camera 27, and controls part camera 27 to image the component picked up by nozzle 24. Subsequently, mounting control device 29 determines the pickup position deviation and the pickup angle deviation of the component picked up by nozzle 24 based on the obtained captured image, and corrects the target mounting position and the target mounting angle of the component so that the pickup position deviation and the pickup angle deviation are eliminated. Then, mounting control device 29 controls head moving device 25 to move head 23 above board S and lowers nozzle 24 to mount the component at the target mounting position and the target mounting angle on board S. In the present embodiment, in a case where the mounting position and the mounting angle read out from the production program are corrected using the correction values set based on the inspection result of mounting inspection device 30, the corrected mounting position and the corrected mounting angle are used as the target mounting position and the target mounting angle. Alternatively, in a case where such a correction is not performed, the mounting position and the mounting angle read out from the production program are used as the target mounting position and target mounting angle.

Figure 5:
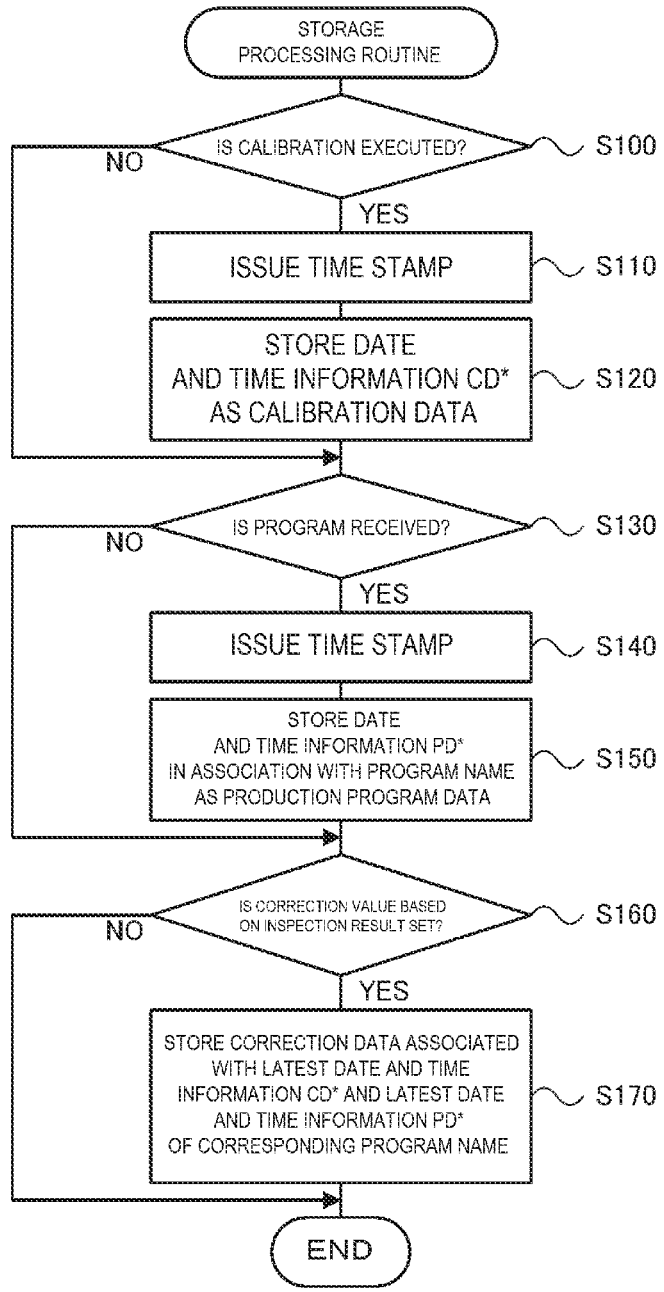
FIG. 5 is a flowchart showing an example of a storage processing routine.
Figure 6:
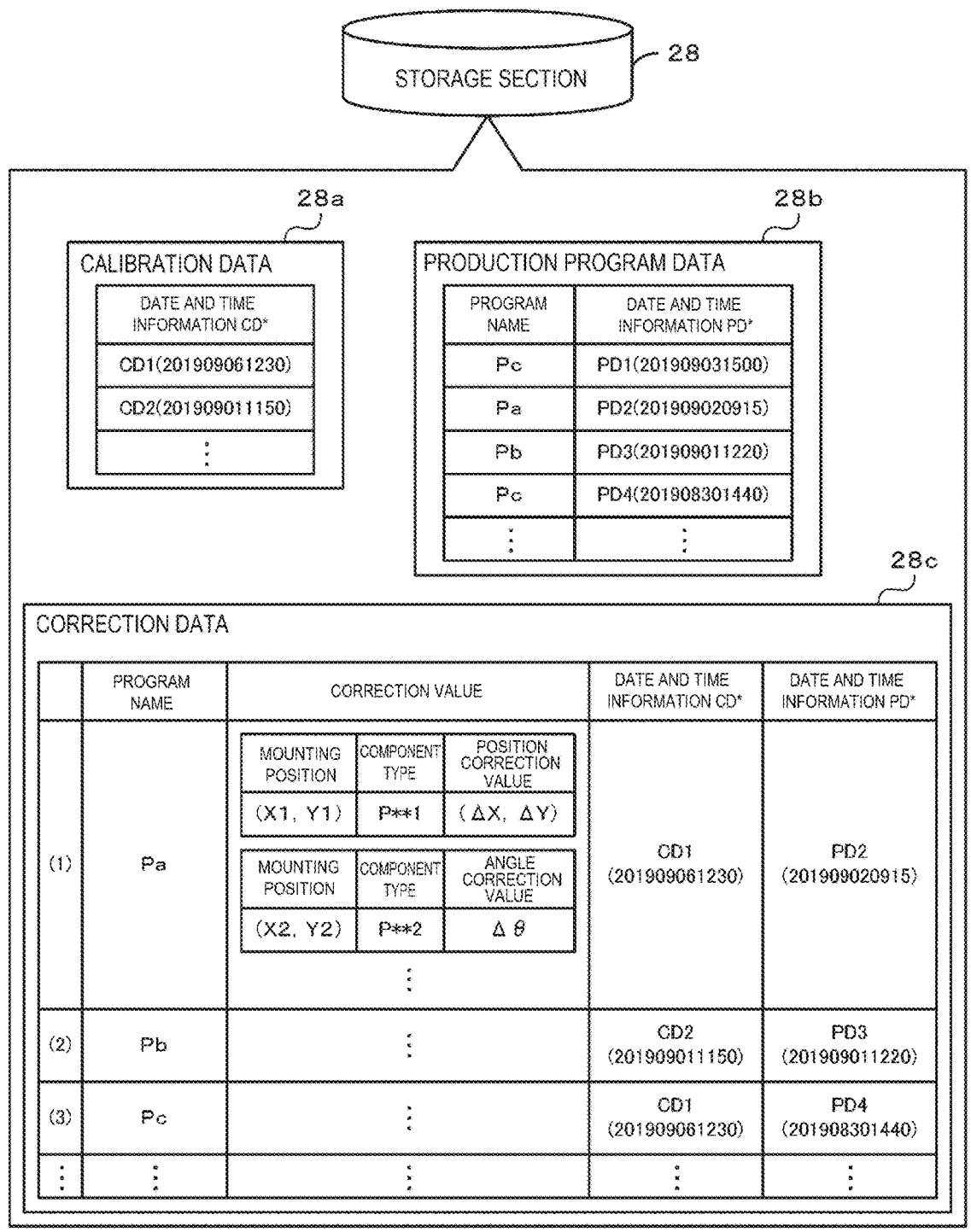
FIG. 6 is a diagram illustrating an example of each data stored in the storage processing routine.

In the following, first, processing in which mounting control device 29 of each mounting device 20 makes storage section 28 store data will be described. FIG. 5 is a flowchart showing an example of a storage processing routine, and FIG. 6 is a diagram illustrating an example of each data stored in the storage processing routine. When this routine is started, mounting control device 29 first determines whether the calibration by calibration section 29a has been executed in mounting device 20 (S100), and proceeds to S130 in a case where mounting control device 29 determines that the calibration has not been executed. On the other hand, mounting control device 29 makes time stamp issuing section 29c issue a time stamp (S110) in a case where mounting control device 29 determines that the calibration has been executed, and makes storage section 28 store date and time information of the calibration (first date and time information, execution date and time information, and calibration date and time information) CD* as calibration data 28a of storage section 28 (S120). As shown in FIG. 6, the date and time when the calibration has been executed are stored (registered) as calibration data 28a. For convenience of description, multiple date and time information is shown, and the latest date and time information 201909061230 (12:30 on Sep. 6, 2019) is referred to as date and time information CD1, and date and time information 201909011150 immediately before the date and time information CD1 is referred to as date and time information CD2. However, only the latest date and time information CD1 may be stored as calibration data 28a.

Next, mounting control device 29 determines whether the production program transmitted from management device 40 has been received by program reception section 29b (S130), and proceeds to S160 in a case where mounting control device 29 determines that the production program has not been received. On the other hand, mounting control device 29 makes time stamp issuing section 29c issue a time stamp (S140) in a case where mounting control device 29 determines that the production program has been received, and makes storage section 28 store date and time information in association with the production program name (second date and time information, update date and time information, and production program date and time information) PD* as production program data 28b of storage section 28 (S150). Since the production program of which the creation or the update has been completed in management device 40 is transmitted to mounting control device 29 and then mounting control device 29 determines in S130 that the production program has received, the time stamp issued in S140 corresponds to the date and time when the production program has been created and updated. Creating a production program means creating a new production program by defining the above-mentioned various kinds of information, and updating a production program means correcting a part of the information included in the existing production program that has already been created. As shown in FIG. 6, multiple date and time information PD* indicating the date and time when the production program has been created or updated is stored in association with the program name, as production program data 28b. For example, in production program data 28b, a production program Pa is associated with date and time information PD2, a production program Pb is associated with date and time information PD3, and a production program Pc is associated with date and time information PD1 and PD4. That is, the production program Pc is associated with the date and time information PD1 that is the latest update date and time, and the date and time information PD4 that is the date and time previously created or updated. For convenience of description, an example is shown in which one production program name is stored in association with two or more date and time information PD*, but one production program name may be stored in association with only the latest one date and time information PD*.

Subsequently, mounting control device 29 determines whether correction value setting section 29d has set the correction value based on the inspection result of mounting inspection device 30 (S160), and ends the storage processing routine in a case where mounting control device 29 determines that correction value setting section 29d has not set the correction value. On the other hand, mounting control device 29 makes storage section 28 store the correction value as correction data 28c of storage section 28 in association with the latest date and time information CD* of calibration data 28a and the latest date and time information PD* of the corresponding production program name of production program data 28b (S170) in a case where mounting control device 29 determines that correction value setting section 29d has set the correction value, and ends the storage processing routine.

As shown in FIG. 6, correction data 28c is stored in association with the production program and the mounting position, the component type, and the like included in the production program. In (1) of correction data 28c, a position correction value ($\Delta X$, $\Delta Y$) is set in a component type P1 of a mounting position (X1, Y1) of the production program Pa, and an angle correction value $\Delta \theta$ is set in a component type P2 of a mounting position (X2, Y2) of a production program Pa. Both the position correction value and the angle correction value may be set at each mounting position. Further, the same correction value may be set for components of the same component type even in a case where the mounting positions are different from each other, and the same correction value may be set for multiple mounting positions included in a predetermined range even in a case where the mounting positions or component types are different from each other. Further, in correction data 28c, the correction value is stored in association with the date and time information CD* and the date and time information PD*. For example, (1) of correction data 28c indicates that the correction value of the production program Pa is associated with the date and time information CD1 and the date and time information PD2 and is set after the execution of the calibration of the date and time information CD1 and after the reception of the production program Pa of the date and time information PD2. Further, (2) of correction data 28c indicates that the correction value of the production program Pb is associated with the date and time information CD2 and the date and time information PD3 and is set after the execution of the calibration of the date and time information CD2 and before the execution of the calibration of the date and time information CD1, and after the reception of the production program Pb of the date and time information PD3. Further, (3) of correction data 28c indicates that the correction value of the production program Pc is associated with the date and time information CD2 and the date and time information PD4 and is set after the execution of the calibration of the date and time information CD1, and after the reception of the production program Pc of the date and time information PD4 and before the reception of the production program Pc of the date and time information PD1.

Figure 7:
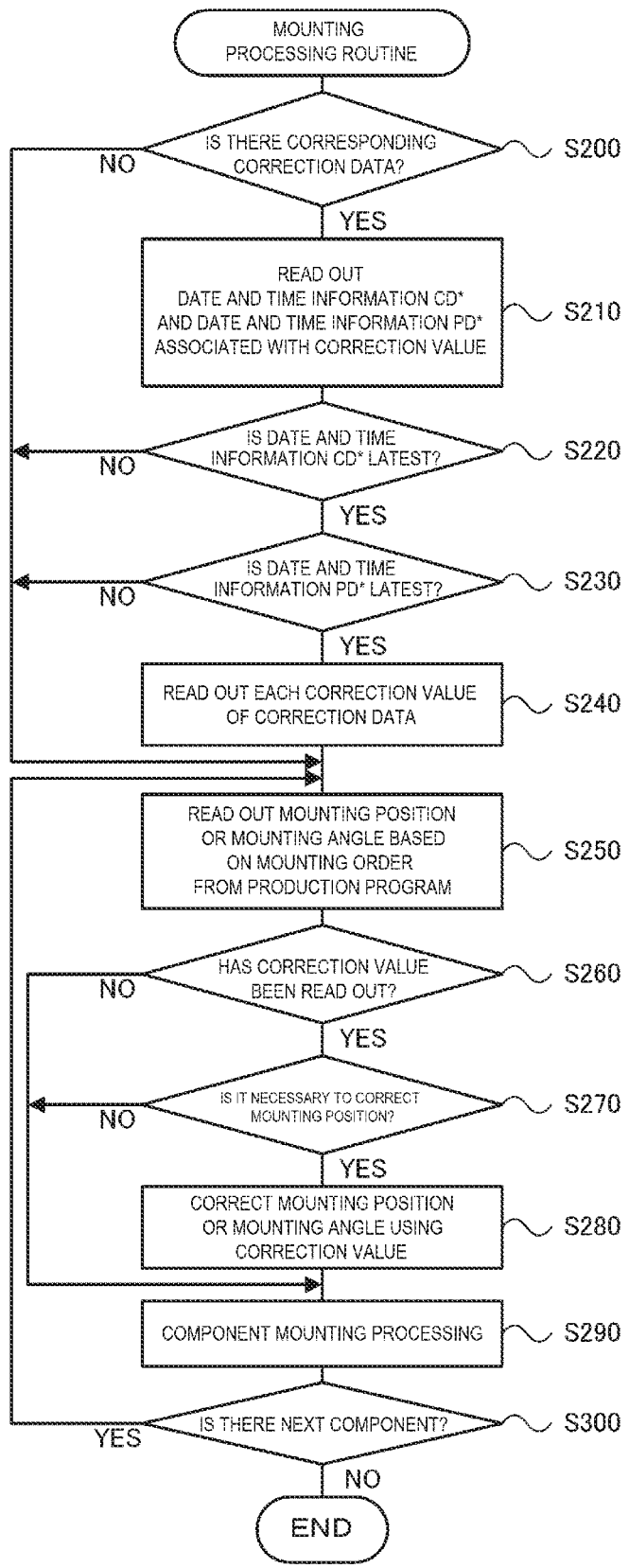
FIG. 7 is a flowchart showing an example of a mounting processing routine.

Next, the operation of mounting device 20 when the component is mounted on board S will be described. FIG. 7 is a flowchart showing an example of a mounting processing routine. When this routine is started, mounting control device 29 first determines whether there is correction data corresponding to the production program name of the production program for performing mounting processing in storage section 28 (S200), and proceeds to S250 in a case where mounting control device 29 determines that there is no correction data corresponding to the production program name. On the other hand, mounting control device 29 reads out the date and time information CD* and the date and time information PD* associated with correction data (S210) in a case where mounting control device 29 determines that there is the correction data corresponding to the production program name.

Subsequently, mounting control device 29 determines whether the read-out date and time information CD* matches the latest date and time information CD* of calibration data 28*a* (S220), and whether the read-out date and time information PD* matches the latest date and time information PD* of the corresponding production program name of production program data 28*b* (S230). Then, mounting control device 29 reads out each correction value of the correction data in a case where the date and time information CD* matches the latest date and time information CD* and the date and time information PD* matches the latest date and time information PD* (S240), and proceeds to S250. On the other hand, mounting control device 29 skips S240 in a case where the date and time information CD* does not match the latest date and time information CD* or the date and time information PD* does not match the latest date and time information PD*, and proceeds to S250. That is, mounting control device 29 proceeds to S250 without reading out the correction value in a case where the date and time information CD* associated with the correction data does not match the latest date and time information CD* and the date and time information PD* associated with the correction data does not match the latest date and time information PD*.

Next, mounting control device 29 reads out the mounting position, the mounting angle, and the like of the component from the current production program based on the mounting order (S250), and determines whether a correction value has been read out in the processing of S240 (S260) and determines whether the mounting position needs to reflect the read-out correction values (S270). Mounting control device 29 corrects the mounting position and the mounting angle using correction values (S280) in a case where mounting control device 29 determines that the correction values have been read out and that the mounting position needs to reflect the correction values, and mounts the component using the corrected mounting position and the corrected mounting angle as the above-mentioned target mounting position and target mounting angle (S290). For example, mounting control device 29 determines that the mounting position needs to reflect the correction value in a case where the correction value of (1) of FIG. 6 has been read out and the current mounting position is the mounting position (X1, Y1) or the mounting position (X2, Y2), and corrects the mounting position in S280. On the other hand, mounting control device 29 skips S280 in a case where the correction value has not been read out or the mounting position does not need to reflect the correction value, and mounts the component using the mounting position and the mounting angle read out from the production program as the above-mentioned target mounting position and target mounting angle (S290). When the component is mounted in this manner, mounting control device 29 determines whether there is the next component of a mounting target (S300), and returns to S250 to perform processing in a case where mounting control device 29 determines that there is the next component or ends the mounting processing routine in a case where mounting control device 29 determines that there is no next component.

For example, in the case of (2) of correction data 28*c* of FIG. 6, mounting control device 29 reads out the date and time information CD2 and the date and time information PD3 associated with the correction value. Then, mounting control device 29 determines that the date and time information PD3 matches the latest date and time information PD3 of the production program Pb, but the date and time information CD2 does not match the latest date and time information CD1 of calibration data 28*a*. Here, the mounting position deviation or the mounting angle deviation of the component may not occur because the cause is eliminated when the calibration is executed, regardless of whether the cause is known. In that case, the continuous use of the correction value set before the execution of the calibration even after the execution of the calibration causes the positional deviation on the contrary. For example, in FIG. 4, in a case where the correction value $\Delta X$ is used even though the positional deviation of the deviation amount Xa to the left side in the X-direction has been eliminated by the execution of the calibration, the positional deviation of $\Delta X$ to the right side in the X-direction occurs. In that regard, mounting control device 29 stores, in a case where a correction value based on the inspection result is set, the correction value in association with the date and time information CD* of the calibration, to correct the mounting position using the correction value associated with the latest date and time information CD*. With this, it is possible to prevent the correction value set before the execution of the calibration from being used after the execution of the calibration.

Further, in the case of (3) of correction data 28*c* of FIG. 6, mounting control device 29 reads out the date and time information CD1 and the date and time information PD4 associated with the correction value. Then, mounting control device 29 determines that the date and time information CD1 matches the latest date and time information CD1 of calibration data 28*a*, but the date and time information PD4 does not match the latest date and time information PD1 of the production program Pc of the production program data 28*b* and matches the date and time information PD4 immediately before the date and time information PD1 of the production program Pc. Here, the mounting position deviation or the mounting angle deviation of the component may not occur because the cause is eliminated when various kinds of information of the production program are corrected, regardless of whether the cause is known. The mounting positional deviation or the mounting angle deviation may be eliminated, for example, in a case where the operator reviews and corrects the mounting position or the mounting angle of the production program, information on the shape of the component, or the like for the component in which the positional deviation or the angle deviation has occurred. In that case, the continuous use of the correction value set before the update of the production program even after the update of the production program causes the positional deviation on the contrary. In that regard, mounting control device 29 stores, in a case where a correction value based on the inspection result is set, the correction value in association with the date and time information PD*, to correct the mounting position using the correction value associated with the latest date and time information PD* of the corresponding production program. With this, it is possible to prevent the correction value set before the update of the production program from being used after the update of the production program.

Meanwhile, in the case of (1) of correction data 28c of FIG. 6, mounting control device 29 reads out the date and time information CD1 and the date and time information PD2 associated with the correction value, and determines that the date and time information CD1 matches the latest date and time information CD1 and that the date and time information PD2 matches the latest date and time information PD2 of the production program Pa. That is, after the correction value is set, the calibration is not executed and the production program Pa is not updated. Therefore, mounting control device 29 can read out the correction value of (1) of correction data 28c and appropriately perform the component mounting processing while correcting the mounting position and the mounting angle based on the correction value.

Here, a correspondence relationship between constituent elements of the present embodiment and constituent elements of the present disclosure will be clarified. Mounting device 20 of the present embodiment corresponds to the component mounting device, storage section 28 corresponds to the storage section, correction value setting section 29d of mounting control device 29 corresponds to the setting section, mounting control device 29 that executes the storage processing routine of FIG. 5 corresponds to the storage control section, and mounting control device 29 that executes the processing of S220, (S230), and S250 to S280 of the mounting processing routine of FIG. 7 corresponds to the correction section. In the present embodiment, the operation of mounting device 20 is described, whereby an example of the correction value managing method of the present disclosure is also clarified.

Mounting device 20 of the present embodiment described above makes the storage section 28, when a correction value is set based on the inspection result, store the correction value in association with the latest date and time information CD* of the calibration. Then, mounting device 20 performs the correction related to the mounting position using the correction value corresponding to the latest date and time information CD* of the calibration without using the correction value not corresponding to the latest date and time information CD*. Consequently, with simple processing of storing the correction value in association with the latest date and time information CD*, it is possible to use the correction value appropriately by preventing the correction value set before the execution of the calibration from being continuously used even after the execution of the calibration.

Further, mounting device 20 makes the storage section 28, when a correction value is set based on the inspection result, store the correction value in association with the date and time information PD* of the production program. Then, mounting device 20 uses the correction value corresponding to the latest date and time information PD* of the production program and the latest date and time information CD* without using the correction value not corresponding to the latest date and time information PD*. Therefore, the correction value set before the update of the production program or before the execution of the calibration is continuously used even after the update of the production program or after the execution of the calibration, so that it is possible to restrain the occurrence of a defect related to the mounting position on the contrary.

It goes without saying that the present disclosure is not limited to the above-mentioned embodiments and may be carried out in various aspects within the technical scope of the present disclosure.

For example, in the above-mentioned embodiments, mounting control device 29 makes the storage section 28 store the correction value in association with both the date and time information CD* of the calibration and the date and time information PD* of the production program; however, the configuration is not limited to this. For example, mounting control device 29 may make the storage section 28 store the correction value in association with only one of the date and time information CD* and the date and time information PD*. For example, mounting control device 29 may omit the processing of S130 to S150 of the storage processing routine of FIG. 5, store the correction value in association with only the date and time information CD* in S170, and omit the processing of S230 in the mounting processing routine of FIG. 7. Alternatively, mounting control device 29 may omit the processing of S100 to S120 of the storage processing routine of FIG. 5, store the correction value in association with only the date and time information PD* in S170, and omit the processing of S220 in the mounting processing routine of FIG. 7.

Alternatively, in mounting control device 29, at least one of the date and time information CD* and the date and time information PD*, and date and time information of the maintenance work of mounting device 20 performed by the operator (third date and time information, work date and time information, and maintenance date and time information) and the like may be associated with the correction value. In such a case, the input operation screen of mounting device 20, input device 46 of management device 40, or the like allows the operator to input that the maintenance work has been performed, and mounting control device 29 issues a time stamp when the input of the maintenance work is received and stores the time stamp in the storage section 28 or the like. Then, mounting control device 29 also stores, when a correction value is set based on the inspection result, the correction value in association with the date and time information of the maintenance work in the storage section 28, and corrects the mounting position using the correction value associated with the latest date and time information of the maintenance work without using the correction value not associated with the latest date and time information of the maintenance work. The maintenance work includes, for example, the adjustment work of the optical axis of mark camera 26 or part camera 27, the tightening work of the fastening members such as screws and bolts for fixing the camera, and the wiping (cleaning) work of dust, grease, or the like from the lens of mark camera 26 or part camera 27.

In the above-mentioned embodiments, mounting control device 29 has a function of issuing a time stamp; however, the configuration is not limited to this, and for example, the time stamp or the like issued from management device 40 may be received by communication via LAN 18.

In the above-mentioned embodiments, the correction value $\Delta X$ in the X-direction, the correction value $\Delta Y$ in the Y-direction, and the angle correction value $\Delta \theta$ are shown as an example of the correction value; however, the configuration is not limited to this, and a correction value related to the mounting position, such as setting the correction value $\Delta X$ in the X-direction and the correction value $\Delta Y$ in the Y-direction other than the angle correction value $\Delta \theta$, need only be used.

Here, the component mounting device of the present disclosure may be configured as follows. For example, in the first component mounting device of the present disclosure, the storage control section may make the storage section store date and time information on which the production program is created or updated for each production program, and make the storage section store the correction value in association with latest date and time information of the production program and the latest date and time information of the calibration when the correction value is set, and the correction section may use the correction value corresponding to the latest date and time information of the production program and the latest date and time information of the calibration without using the correction value not corresponding to the latest date and time information of the production program. By doing so, the correction value set before the update of the production program or before the execution of the calibration is continuously used even after the update of the production program or after the execution of the calibration, so that it is possible to restrain the occurrence of a defect related to the mounting position on the contrary.

A gist of a first correction value managing method of the present disclosure of managing a correction value related to a mounting position of a component when performing mounting processing for mounting the component on a board based on a production program is a correction value managing method including: (a) a step of setting the correction value related to the mounting position of the component included in the production program; (b) a step of making a storage section store date and time information on which calibration related to the mounting processing is executed when the calibration is executed, and of making the storage section store the correction value in association with latest date and time information of the calibration when the correction value is set; and (c) a step of performing a correction related to the mounting position using the correction value corresponding to the latest date and time information of the calibration without using the correction value not corresponding to the latest date and time information.

In the first correction value managing method of the present disclosure, as in the above-mentioned first component mounting device, the correction value set before the execution of the calibration is continuously used even after the execution of the calibration, so that it is possible to restrain the occurrence of a defect related to the mounting position on the contrary. Accordingly, the correction value when the component is mounted can be appropriately used without complicated processing.

A gist of a second correction value managing method of the present disclosure of managing a correction value related to a mounting position of a component when performing mounting processing for mounting the component on a board based on a production program is a correction value managing method including: (a) a step of setting the correction value related to the mounting position of the component included in the production program; (b) a step of making a storage section store date and time information on which the production program is created or updated for each production program, and of making the storage section store the correction value in association with latest date and time information of the production program when the correction value is set; and (c) a step of performing a correction related to the mounting position using the correction value corresponding to the latest date and time information of the production program without using the correction value not corresponding to the latest date and time information.

In the second correction value managing method of the present disclosure, as in the above-mentioned second component mounting device, the correction value set before the update of the production program is continuously used even after the update of the production program, so that it is possible to restrain the occurrence of a defect related to the mounting position on the contrary. Accordingly, the correction value when the component is mounted can be appropriately used without complicated processing.

INDUSTRIAL APPLICABILITY

The present disclosure can be applied to a manufacturing industry of component mounting devices, and the like.

REFERENCE SIGNS LIST

10: board work system, 12: printing device, 14: print inspection device, 18: LAN, 20: mounting device, 21, 32: board conveyance device, 22: component supply device, 23: head, 24: nozzle, 25: head moving device, 26: mark camera, 27: part camera, 28: storage section, 28a: calibration data, 28b: production program data, 28c: correction data, 29: mounting control device, 29a: calibration section, 29b: program reception section, 29c: time stamp issuing section, 29d: correction value setting section, 29e: mounting processing section, 30: mounting inspection device, 34: inspection camera, 36: camera moving device, 39: inspection control device, 40: management device, 42: management control device, 44: storage section, 46: input device, 48: display, S: board

The invention claimed is:

1. A component mounting device that performs mounting processing for mounting a component on a board based on a production program, the device comprising:
   a storage section configured to store information;
   a setting section configured to set a correction value related to a mounting position of the component included in the production program;
   a storage control section configured to make the storage section store:
      date and time information of when calibration of the mounting processing is executed, and
      the correction value in association with date and time information of the calibration when the correction value is set; and
   a correction section configured to:
      perform a correction related to the mounting position when the date and time information of the calibration when the correction value is set correction is a latest date and time information of the calibration, and
      skip the correction related to the mounting position when the date and time information of the calibration when the correction value is set is older than the latest date and time information of the calibration.

2. The component mounting device according to claim 1, wherein the storage control section is configured to make the storage section store:
      date and time information of when the production program is created or updated for each production program, and
      the correction value in association with the date and time information of the production program when the correction value is set, and the correction section is configured to:
      perform the correction related to the mounting position when the date and time information of the production program when the correction value is set is a latest date and time information of the production program, and
      skip the correction related to the mounting position when the date and time information of the production program when the correction value is set is older than the latest date and time information of the production program.

3. A component mounting device that performs mounting processing for mounting a component on a board based on a production program, the device comprising:
- a storage section configured to store information;
- a setting section configured to set a correction value related to a mounting position of the component included in the production program;
- a storage control section configured to make the storage section store:
  - date and time information of when the production program is created or updated for each production program, and
  - the correction value in association with the date and time information of the production program when the correction value is set; and
- a correction section configured to:
  - perform a correction related to the mounting position when the date and time information of the production program when the correction value is set is a latest date and time information of the production program, and
  - skip the correction related to the mounting position when the date and time information of the production program when the correction value is set is older than the latest date and time information of the production program.

4. A correction value managing method of managing a correction value related to a mounting position of a component when performing mounting processing for mounting the component on a board based on a production program, the method comprising:
- (a) a step of setting the correction value related to the mounting position of the component included in the production program;
- (b) a step of making a storage section store:
  - date and time information of when calibration related to the mounting processing is executed, and the correction value in association with date and time information of the calibration when the correction value is set;
- (c) a step of performing a correction related to the mounting position when the date and time information of the calibration when the correction value is set is a latest date and time information of the calibration; and
- (d) skipping the correction related to the mounting position when the date and time information of the calibration when the correction value is set is older than the latest date and time information of the calibration.

5. A correction value managing method of managing a correction value related to a mounting position of a component when performing mounting processing for mounting the component on a board based on a production program, the method comprising:
- (a) a step of setting the correction value related to the mounting position of the component included in the production program;
- (b) a step of making a storage section store:
  - date and time information of when the production program is created or updated for each production program, and
  - the correction value in association with latest date and time information of the production program when the correction value is set; and
- (c) a step of performing a correction related to the mounting position when the date and time information of the calibration when the correction value is set is a latest date and time information of the production program; and
- (d) skipping the correction related to the mounting position when the date and time information of the production program when the correction value is set is older than the latest date and time information of the production program.

* * * * *